United States Patent [19]

Pecone

[11] Patent Number: 5,448,143
[45] Date of Patent: Sep. 5, 1995

[54] SENSOR FOR MONITORING FAN OPERATION IN A PC OR PC BASED SYSTEM

[75] Inventor: Victor K. Pecone, Austin, Tex.
[73] Assignee: Dell USA, L.P., Austin, Tex.
[21] Appl. No.: 153,698
[22] Filed: Nov. 17, 1993
[51] Int. Cl.$^6$ .......................... H02H 7/08; H02H 7/20
[52] U.S. Cl. ...................... 318/434; 361/23; 361/31
[58] Field of Search .................. 318/434; 361/23, 24, 361/25, 28, 29, 31, 90, 91, 92, 93

[56] References Cited

U.S. PATENT DOCUMENTS

| | | |
|---|---|---|
| 3,809,960 | 5/1974 | Jossic . |
| 4,030,012 | 6/1977 | Buhler ............................. 318/565 |
| 4,035,692 | 7/1977 | Luy et al. . |
| 4,290,000 | 9/1981 | Sun ..................... 318/566 |
| 4,558,264 | 12/1985 | Weischedel ............... 318/254 |
| 4,752,851 | 6/1988 | Ritter . |
| 4,901,181 | 2/1990 | Miyanaga et al. . |

Primary Examiner—Bentsu Ro
Attorney, Agent, or Firm—Michael Heim; David McCombs; James Huffman

[57] ABSTRACT

A sensor circuit for monitoring the operation of a fan in an electronic device includes a current sensor that produces a voltage signal proportional to the magnitude of the current flowing through the fan. The proportional voltage signal is filtered to extract an rms dc signal that then is compared with a minimum and maximum voltage threshold in two voltage comparators. If the voltage of the filtered signal exceeds the maximum threshold value, or is less than the minimum threshold value, a fan failure signal is generated and transmitted to an external monitoring unit. The sensor circuit can be implemented with a standard two-wire fan and interface connector.

3 Claims, 1 Drawing Sheet

SENSOR FOR MONITORING FAN OPERATION IN A PC OR PC BASED SYSTEM

BACKGROUND OF THE INVENTION

The present invention relates generally to a system for monitoring thermal cooling in an electronic device. More particularly, the present invention relates to a sensor for monitoring the operation of a fan in a personal computer or computer based system.

A fan is a standard component in most commercial personal computers (PC's). The fan provides thermal cooling to the integrated circuits and the other critical components of the PC. Fans also are used in many other electronic devices and PC-based systems for the same reason. Without appropriate cooling, the electronic circuits and components in these devices are subject to premature failure, necessitating expensive repairs or replacement of the device itself. Because excessive temperature is so detrimental to electrical circuits and components, proper fan operation is critical to the operation and maintenance of these electronic devices. Many of the more sophisticated computer systems include thermal monitoring as part of an overall system management capability.

The computer systems that have thermal monitoring capabilities generally use either (1) a customized fan assembly with a built-in rotational sensor for detecting angular velocity of the fan or (2) a sensor positioned adjacent the fan to monitor the air flow generated by the fan. Both of these structures have inherent disadvantages.

The customized fan assembly is more expensive than the standard fan used in most PC's. In addition, because it is a special part, it is more difficult to procure the customized assembly than it is to obtain the standard fan. The typical fan that is mounted in a PC receives DC power from a two terminal interface connector located in the PC. The two terminal interface connector electrically connects the fan to a voltage source and ground, respectively. Using the customized fan assembly in a PC requires a third electrical terminal to provide an electrical output from the rotational sensor. As a result, a special three terminal interface connector is required to accommodate the electrical output from the rotational sensor. In addition, the rotational sensor provides an output signal that is frequency-based (for example, the rotational sensor provides an electrical output signal for each revolution of the fan). Before the PC can use the frequency-based signal from the rotational sensor, it must be converted to a voltage signal by a frequency to voltage converter.

The use of the customized fan, therefore, has several disadvantages. These disadvantages include (1) higher fan cost and longer procurement lead times for the customized fan than for the standard PC fan; (2) a special fan connector interface to provide a three wire terminal instead of the standard two-wire connector; and (3) a frequency-to-voltage converter circuit or processor to convert the electrical output signal from the rotational sensor to a voltage signal that can be used by the system management circuitry in the PC.

Similarly, the sensor for monitoring air flow has certain inherent disadvantages which limits its application. One limitation is that the air flow sensor must be positioned adjacent the fan in order to sense air flow. A second limitation is that air flow sensors are relatively expensive.

Using the prior art fan monitors, therefore, results in higher component and assembly costs and certain design related restrictions in the electronic device or PC. Consequently, these monitors have been used sparingly.

It would be advantageous to develop a simple, low cost fan monitoring system that can be implemented with the standard fan assembly to provide an indication of fan failure. It would also be advantageous if the fan monitoring system could be located independently of the fan. Still another advantage would be to provide a fan monitoring system that provides a voltage output signal indicative of fan failure.

These and other objects and advantages of the invention, constructed in accordance with the preferred embodiment, will be apparent from the following description.

SUMMARY OF THE INVENTION

Accordingly, there is provided an improved sensor circuit for monitoring fan operation in a PC or other electronic device. The sensor circuit preferably connects to the fan through a conventional two-wire interface connector and includes a current sensor that provides a proportional voltage signal indicative of the current through the fan. A filter preferably extracts the root mean square (rms) average of the proportional voltage signal and provides this rms signal, which is a dc signal, to a pair of voltage comparators. The first voltage comparator compares the rms dc signal from the filter with a maximum threshold and provides an output signal indicative of fan failure if the voltage of the rms dc signal exceeds the maximum threshold. The second voltage comparator compares the rms dc signal with a minimum threshold and provides a signal indicative of fan failure if the voltage of the filtered signal is less than the minimum threshold. Preferably a system microcontroller receives the fan failure output signal from the comparators and provides necessary system shut-down and warnings in the event of a fan failure.

A sensor circuit made in accordance with the principles of the present invention is inexpensive to manufacture and to install by comparison to the prior art techniques currently in use and has the additional advantage of providing a single bit voltage output signal indicative of fan failure. In addition, the sensor circuit of the present invention preferably is used with a standard fan assembly and can be positioned independent of the position of the fan.

These and other characteristics and advantages of the present invention will become readily apparent to those skilled in the art upon reading the following detailed description and claims and by referring to the accompanying drawings.

DESCRIPTION OF THE DRAWINGS

For a more detailed description of the preferred embodiment of the present invention, reference will now be made to the accompanying drawing, wherein.

DETAILED DESCRIPTION OF THE PREFERRED EMBODIMENT

Figure 1:
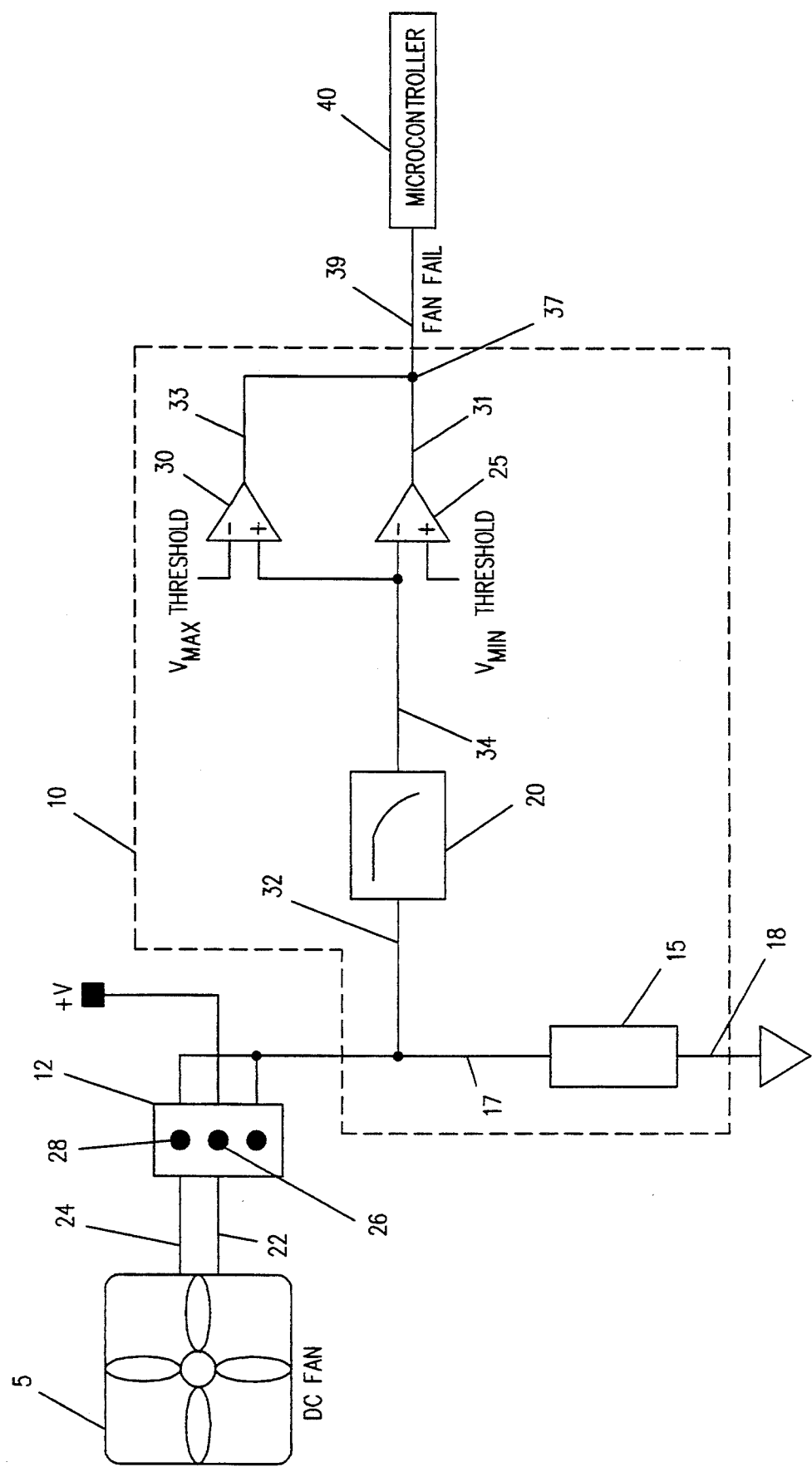
FIG. 1 is a schematic illustration of a fan monitor circuit constructed in accordance with the preferred embodiment.

The invention constructed in accordance with the preferred embodiment comprises a fan monitor sensor circuit for monitoring the operation of a DC fan used in a personal computer ("PC") or other electronic device. When describing this invention, it will be discussed with reference to its use in a PC. As one skilled in the art will realize, however, this invention can also be used in a PC based system or other electronic device requiring thermal cooling, without departing from the principles of the present invention.

The fan monitor circuit of the present invention preferably is used with a standard two-wire DC fan and two-wire interface connector. As shown in FIG. 1, the standard two-wire fan 5 includes two electrical leads that connect electrically to the standard two-wire interface connector 12. In accordance with normal convention, the two electrical leads of the fan 5 preferably comprise a positive or "power" conductor 22 and a negative or "ground" conductor 24. The two-wire interface connector 12 preferably includes two terminals 26, 28. The positive conductor 22 connects electrically to terminal 26 of the interface connector 12. A voltage source, +V, also connects to terminal 26 to provide operating power to the fan through power conductor 26. Similarly, negative conductor 24 connects electrically to terminal 28 of interface connector 12. Terminal 28 preferably connects the negative conductor 24 to ground.

Referring still to FIG. 1, the fan monitor sensor circuit 10 constructed in accordance with the preferred embodiment generally comprises a current sensor 15, a filter 20, and two voltage comparators 25, 30. Preferably, the sensor circuit 10 connects electrically between terminal 28 of the standard two-wire fan interface connector 12 and ground without any additional attachments or wires. According to the principals of the present invention, the sensor circuit 10 preferably is located in a position remote from the fan and independent of the area of air flow generated by the fan.

As shown in FIG. 1, the positive lead 17 of the current sensor 15 preferably connects to the negative conductor 24 at terminal 28 of interface connector 12. The negative lead 18 of current sensor 15 connects electrically to ground, thus positioning current sensor 15 between the negative conductor 24 of the fan 5 and ground. In the preferred embodiment, the current sensor 15 comprises a current sensing resistor with a relatively low resistance value. Alternatively, a current transformer or other suitable current sensing device could be used without departing from the principles of the present invention.

The filter 20 preferably comprises an RC low pass filter that includes an input line 32 and an output line 34. The input line 32 of filter 20 connects electrically to the positive lead 17 of current sensor 15. The output line 34 from the filter 20 is provided as an input to the voltage comparators 25, 30. In the preferred embodiment, the filter comprises a 10,000 ohm resistor and a 22 microfarad capacitor (not shown), to provide a time constant of approximately 200 milliseconds. As will be apparent to one skilled in the art, other filters and/or time constants could be used without departing from the principles of the present invention. The filter 20 removes the ac components of the signal on input line 32 and extracts the rms average of the input signal. The rms average is applied as a dc output signal on output line 34. In this manner, the rms dc component of the signal is transmitted from the input line 32 to the output line 34.

Referring still to FIG. 1, the voltage comparators 25, 30, in accordance with convention techniques, include a positive terminal (+) and a negative terminal (−). The output line 34 from the filter 20 connects electrically to the negative terminal of the first voltage comparator 25 and also to the positive terminal of the second voltage comparator 30. The positive terminal of the first voltage comparator 25 preferably connects electrically to a voltage source that represents a predetermined minimum threshold voltage $V_{min}$. The negative terminal of the second voltage comparator 30 preferably connects electrically to a voltage source that represents a predetermined maximum threshold voltage $V_{max}$. The first voltage comparator 25 has an output line 31 and the second voltage comparator 30 has an output line 33 that connect at terminal 37. A single output lead 39 connects to terminal 37 and transmits a failure output signal from comparators 25, 30 to external circuitry 40, such as a microcontroller or other monitoring unit. Alternatively, two separate output lines, such as 31, 33, can be provided directly to the external monitoring unit to permit more precise analysis regarding the fan failure. In addition, a positive feedback loop may be used on the first voltage comparator to compensate for the effects of the hysteresis. In the preferred embodiment, an 8 bit microcontroller is provided as the monitoring unit 40. Preferably the monitoring unit interfaces to other system components and provides an output indicative of system failure to an operator.

The operation of the fan monitor sensor circuit 10 will now be discussed with reference to the preferred embodiment of FIG. 1. Operating power for the fan is provided by the DC voltage source, +V, through the interface connector 12, on positive conductor 22. The negative conductor 24 carries current to ground through the current sensing resistor 15 or other current sensor, generating a proportional voltage signal across the resistor or current sensor. The proportional voltage signal is applied to the filter 20 on input line 32. Although the fan 5 operates on dc current, the output current carried on the negative conductor 24 comprises an ac signal because of the operation of the dc fan motor, so the proportional signal also is an ac signal. The filter 20 effectively filters out the ac waveform and extracts the rms dc component from the proportional signal. The filtered signal, comprising the rms dc component of the proportional signal, then is provided on output line 34 and transmitted to the voltage comparators 25, 30, where the filtered signal is compared with a minimum and maximum threshold, respectively. The first voltage comparator 25 compares the voltage of the filtered signal to a minimum voltage threshold, $V_{min}$. Similarly the second comparator 30 compares the voltage of the filtered signal to a voltage signal representing a maximum threshold value limit, $V_{max}$. The maximum and minimum voltage thresholds ($V_{max}$, $V_{min}$) are preselected, together with the value of current sensing resistor 15, to provide a boundary for normal fan operation. If the proportional filtered signal is less than the minimum voltage threshold, $V_{min}$, the output of the first voltage comparator 25 changes state (goes from low to high or high to low) to indicate improper fan operation. If the filtered signal falls below the minimum voltage, $V_{min}$, this generally indicates one of the following conditions:

(1) locked rotor shutdown of the fan;
(2) an open circuit in the fan motor;
(3) the fan is no longer connected to interface connector 12; or (4) the fan is operating below the minimum specified rpm (probably because of worn bearings).

Conversely, if the proportional filtered voltage signal exceeds the maximum voltage, $V_{max}$, the output of the second voltage comparator 30 changes state indicating improper fan operation. If the proportional voltage signal exceeds the maximum voltage, $V_{max}$, this generally indicates either a locked rotor or an abnormally high current draw by the fan motor.

When a failure signal is detected on the output line 39, the microcontroller 40 preferably transmits a fail alert to other components in the system. In addition, the microcontroller preferably performs orderly system shutdown functions and transmits a warning signal to the operator.

The present invention can be implemented with any PC, or PC-based system, or other electronic device that uses standard DC fans. While a preferred embodiment of the invention has been shown and described, modifications thereof can be made by one skilled in the art without departing from the spirit of the invention.

What is claimed is:

1. A sensor circuit for monitoring the operation of a fan in a personal computer, said fan including a first terminal and a second terminal, said sensor circuit comprising:

a current sensor resistor connected to the first terminal of the fan for providing a proportional voltage signal that is proportional to the magnitude of current flowing through the first and second terminals of the fan;

a low pass filter connected to said sensor for receiving and filtering said voltage signal and outputting a filtered DC signal;

a first voltage comparator for comparing the filtered signal with a minimum threshold value and for providing a first output signal representing failure of the fan if the filtered signal falls below said minimum threshold value;

a second voltage comparator for comparing the filtered signal with a maximum threshold value and for providing a second output signal representing failure of the fan if the filtered signal rises above said maximum threshold value, wherein said minimum threshold value is less than said maximum threshold value; and a microcontroller connected to said first and second comparators for receiving and monitoring said first and second output signals and, upon detection of said first or second output signal, transmitting a warning signal and performing orderly system shutdown functions of said personal computer.

2. A sensor circuit for providing a single bit output signal indicative of improper operation of a fan in a personal computer, with the fan having a negative conductor, comprising:

a current sensing resistor connected between the negative conductor and ground to produce a proportional voltage signal that is proportional to the magnitude of current flowing through the negative conductor;

a low pass filter connected electrically to the sensing resistor, said filter receiving the proportional voltage signal and providing a filtered output signal;

a first voltage comparator for comparing the filtered output signal with a maximum reference voltage signal and including an output line onto which a first fan failure signal is output if said filtered signal is greater than said maximum reference voltage signal;

a second voltage comparator for comparing the filtered output signal with a minimum reference voltage signal, wherein an output line of said second voltage comparator is connected to the output line of said first voltage comparator onto which output lines a second fan failure signal is output if said filtered signal is less than said minimum reference voltage signal; and a microcontroller electrically connected to the output lines of said first and second voltage comparators for receiving and monitoring said first and second fan failure signals output thereon and, upon detection of said first or second fan failure signal, transmitting a warning signal and performing orderly system shutdown functions of said personal computer.

3. A method for sensing the failure of a fan in a personal computer, said fan including a positive and negative conductor connected to a power source, comprising the steps of:

(a) sensing the current on the negative conductor;
   (b) providing a proportional voltage signal indicative of the amount of current sensed in step (a);
   (c) filtering said proportional voltage signal by passing the DC component thereof;
   (d) comparing the filtered signal with a predetermined maximum value and with a predetermined minimum value;
   (e) providing an output signal if the filtered signal exceeds the predetermined maximum value or is less than the predetermined minimum value;
   (f) monitoring said output signal with a microcontroller; and
   (g) upon detection of said output signal, transmitting a warning signal and performing orderly system shutdown functions of said personal computer by said microcontroller.

* * * * *